(12) United States Patent
Webb

(10) Patent No.: US 11,313,404 B2
(45) Date of Patent: Apr. 26, 2022

(54) SPRING-LOADED FASTENING SYSTEM FOR PROCESS CHAMBER LINERS

(71) Applicant: APPLIED Materials, Inc., Santa Clara, CA (US)

(72) Inventor: Benjamin F. Webb, Gloucester, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 386 days.

(21) Appl. No.: 16/661,679

(22) Filed: Oct. 23, 2019

(65) Prior Publication Data
US 2021/0123470 A1    Apr. 29, 2021

(51) Int. Cl.
*F16B 39/22* (2006.01)

(52) U.S. Cl.
CPC .................................... *F16B 39/22* (2013.01)

(58) Field of Classification Search
CPC ........................................................ F16B 39/22
USPC ................................................. 411/337, 347
See application file for complete search history.

(56) References Cited

U.S. PATENT DOCUMENTS

| | | | | |
|---|---|---|---|---|
| 1,679,620 A | * | 8/1928 | Moore | F16B 43/00 411/347 |
| 2,884,677 A | * | 5/1959 | Zahodiakin | F16B 5/10 411/552 |
| 3,188,115 A | * | 6/1965 | Morrish | F16L 27/053 285/18 |
| 4,123,132 A | * | 10/1978 | Hardy | F16B 39/24 411/337 |
| 7,731,465 B2 | * | 6/2010 | Stapulionis | F16B 21/165 411/348 |

(Continued)

FOREIGN PATENT DOCUMENTS

| | | |
|---|---|---|
| JP | 61-045612 U | 3/1986 |
| JP | 04-310500 A | 11/1992 |

(Continued)

OTHER PUBLICATIONS

International Search Report dated Jan. 20, 2021, for the International Patent Application No. PCT/US2020/050093, filed on Sep. 10, 2020, 3 pages.

(Continued)

*Primary Examiner* — Roberta S Delisle
(74) *Attorney, Agent, or Firm* — Kacvinsky Daisak Bluni PLLC

(57) ABSTRACT

A spring-loaded fastening system for fastening a liner to a structure, including a spring-loaded fastener with a cleat defining an interior cavity, a spring element disposed on a floor of the interior cavity, and a shoulder bolt with head portion disposed on the spring element, with a shoulder portion of the shoulder bolt extending through a mounting aperture in a floor of the interior cavity and a threaded portion of the shoulder bolt fastened to the structure. The system further includes a hanger pocket in a rear surface of the liner including a first portion with an opening large enough to accommodate a diameter of a lower portion of the cleat and not large enough to accommodate a diameter of an upper portion of the cleat, and a second portion adjoining the first portion with an opening large enough to accommodate the diameter of the upper portion of the cleat.

20 Claims, 7 Drawing Sheets

(56) References Cited

U.S. PATENT DOCUMENTS 8,162,581 B2 * 4/2012 Soltis .................. F16B 19/109
411/348
2007/0125922 A1 6/2007 Arakawa

FOREIGN PATENT DOCUMENTS

JP         07-327746 A    12/1995
KR      20-0127717 Y1   12/1998

OTHER PUBLICATIONS

Written Opinion dated Jan. 20, 2021, for the International Patent Application No. PCT/US2020/050093, filed on Sep. 10, 2020, 4 pages.

* cited by examiner

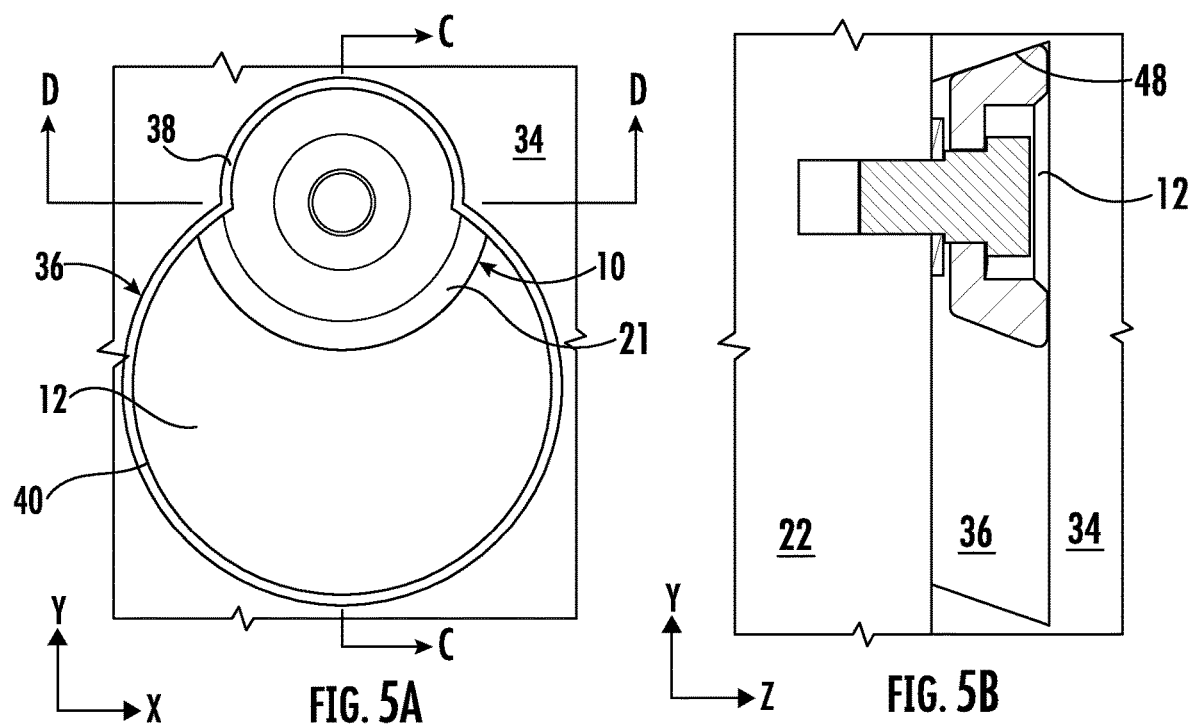

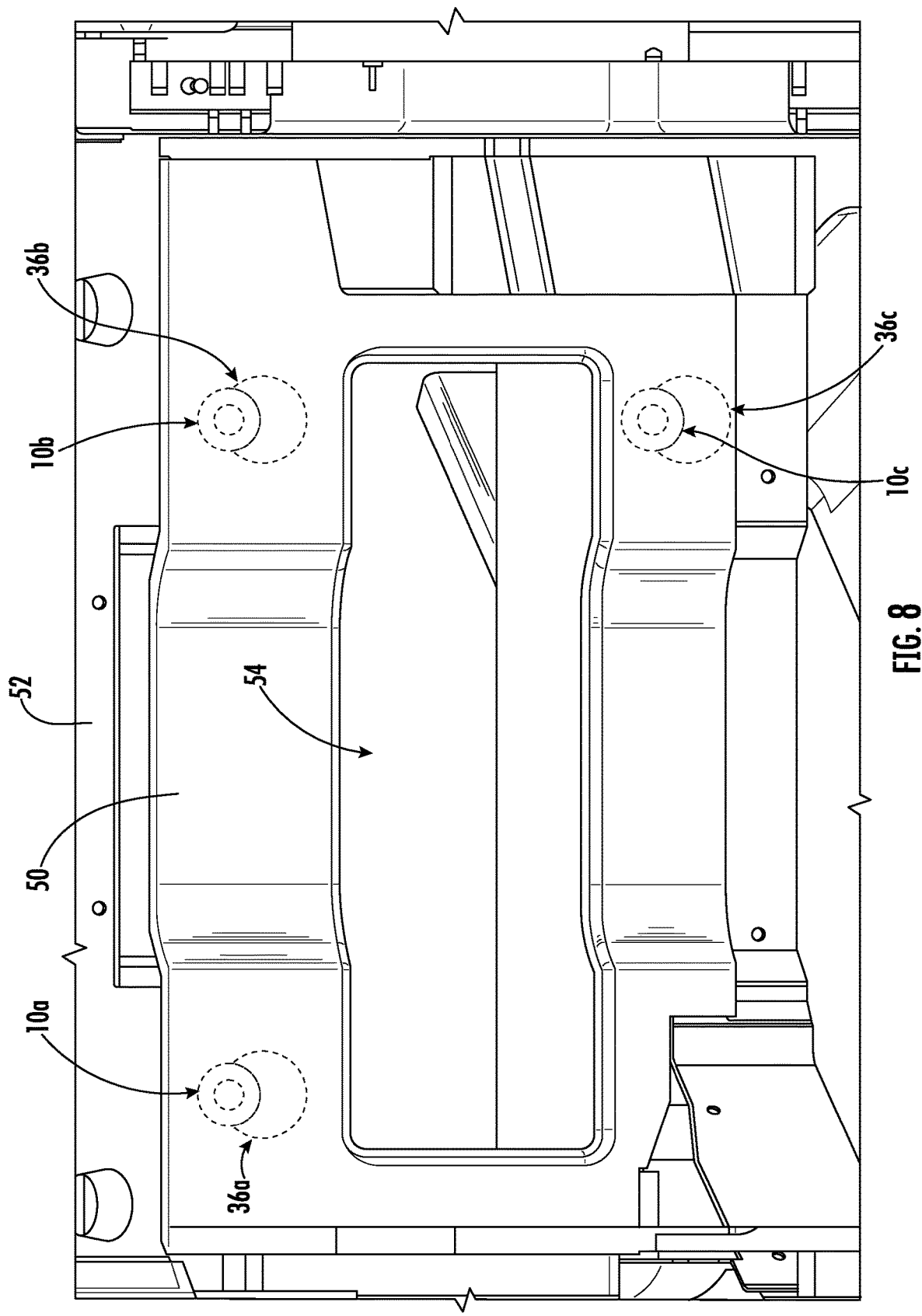

SPRING-LOADED FASTENING SYSTEM FOR PROCESS CHAMBER LINERS

FIELD OF THE DISCLOSURE

Embodiments of the present disclosure relate generally to the field of semiconductor processing equipment, and more particularly to a spring-loaded fastening system for removably mounting liners in process chambers of ion implanters.

BACKGROUND OF THE DISCLOSURE

Ion implantation is a standard technique for introducing property-altering impurities into substrates. During an ion implantation process, a desired impurity material ("dopant") is ionized in a source chamber and the ions are directed through an extraction aperture. The ions are accelerated to form an ion beam of prescribed energy, and the ion beam is directed onto the surface of a substrate located in a process chamber. The energetic ions in the ion beam penetrate the sub-surface of the substrate material and are embedded into the crystalline lattice of the substrate material to form a region of desired conductivity or material property.

Conventional process chambers of ion implanters are made of metal (e.g., aluminum). If left unshielded during an ion implantation process, the interior surface of a process chamber is bombarded with accelerated dopant ions, as well as material sputtered off of the substrate. This may result in a buildup of contamination on the interior surface of the process chamber. The built-up contamination may eventually flake off of the interior surfaces in the form of particles of various sizes. These particles may negatively impact tool functionality and may require extensive cleaning to remediate. To mitigate such buildup and expedite remediation, graphite liners are commonly installed in process chambers to cover such interior surfaces as may be exposed to such contamination. The surface characteristics and geometry of specially processed graphite enables it to more effectively capture contaminants (when compared to bare metal, e.g. aluminum), and thus mitigates flaking of such contaminant buildup. Additionally, the thermal properties of graphite are highly desirable for use where direct impingement of an ion beam is possible.

While conventional graphite liners are generally effective for mitigating contamination within process chambers, such liners are associated with several shortcomings. For example, graphite liners are commonly fastened to the interior surfaces of process chambers with mechanical fasteners formed of metal. Thus, the mechanical fasteners themselves requiring shielding, such as with graphite caps, to avoid contributing to the contamination of a process chamber. The mechanical fasteners and caps create undesirable interruptions and variations in the surface textures of graphite liners. Additionally, graphite is generally very brittle. Thus, when mechanical fasteners (e.g., bolts) are used to secure graphite liners to the interior surfaces of process chambers, specialized tools are often used, and strict torque requirements are observed to avoid breaking the graphite liners. The aforementioned considerations make the installation and removal of graphite liners time-consuming and tedious.

With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

A spring-loaded fastener in accordance with an exemplary embodiment of the present disclosure may include a frustoconical cleat having an interior cavity, a spring element disposed on a floor of the interior cavity, and a shoulder bolt disposed in the interior cavity, wherein a bottom surface of a head portion of the shoulder bolt is disposed on the spring element, and wherein a shoulder portion of the shoulder bolt extends through a mounting aperture in a floor of the interior cavity.

A spring-loaded fastening system in accordance with an exemplary embodiment of the present disclosure may include a spring-loaded fastener including a frustoconical cleat having an interior cavity, a spring element disposed on a floor of the interior cavity, and a shoulder bolt disposed in the interior cavity, wherein a bottom surface of a head portion of the shoulder bolt is disposed on the spring element, wherein a shoulder portion of the shoulder bolt extends through a mounting aperture in a floor of the interior cavity, and wherein a threaded portion of the shoulder bolt is fastened to a structure. The spring-loaded fastening system may further include a hanger pocket in a rear surface of a liner, the hanger pocket including a first portion defining an opening in the rear surface of the liner large enough to accommodate a diameter of a lower portion of the cleat and not large enough to accommodate a diameter of an upper portion of the cleat, and a second portion adjoining the first portion and defining an opening in the rear surface of the liner large enough to accommodate the diameter of the upper portion of the cleat.

A spring-loaded fastening system in accordance with an exemplary embodiment of the present disclosure may include spring-loaded fastener including a frustoconical cleat having an interior cavity, a spring element disposed on a floor of the interior cavity, and a shoulder bolt disposed in the interior cavity, wherein a bottom surface of a head portion of the shoulder bolt is disposed on the spring element, wherein a shoulder portion of the shoulder bolt extends through a mounting aperture in a floor of the interior cavity, and wherein a threaded portion of the shoulder bolt is fastened to a structure. The spring-loaded fastening system may further include a hanger pocket in a rear surface of a liner, the hanger pocket including a first portion defining an opening in the rear surface of the liner large enough to accommodate a diameter of a lower portion of the cleat and not large enough to accommodate a diameter of an upper portion of the cleat, and a second portion adjoining the first portion and defining an opening in the rear surface of the liner large enough to accommodate the diameter of the upper portion of the cleat, wherein a sidewall of the cleat extends from a bottom surface of the cleat at a first angle, and wherein a sidewall of the hanger pocket extends from a rear surface of the liner at a second angle, wherein the first angle is equal to the second angle. The cleat is disposed within the first portion of the hanger pocket and the sidewall of the hanger pocket is disposed on the sidewall of the cleat.

BRIEF DESCRIPTION OF THE DRAWINGS

By way of example, various embodiments of the disclosed system will now be described, with reference to the accompanying drawings, wherein:

FIG. 5A is a rear view illustrating the fastening system of the present disclosure in a final mounting position;

FIG. 5B is a cross-sectional side view taken along plane C-C in FIG. 5A;

FIG. 8 is a perspective view illustrating an exemplary implementation of the fastening system of the present disclosure.

DETAILED DESCRIPTION

Figure 1A:
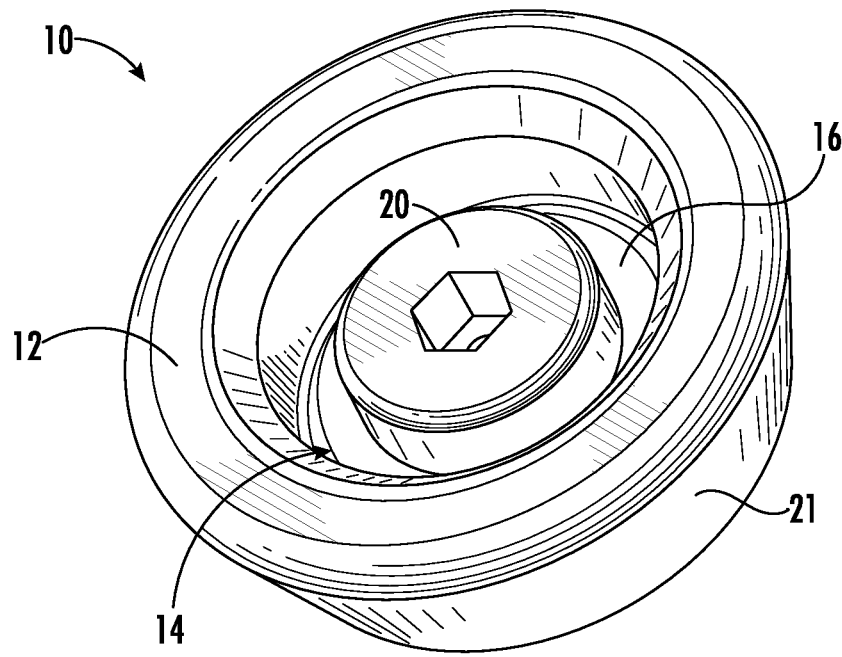
FIG. 1A is a top perspective view illustrating a spring-loaded fastener in accordance with an exemplary embodiment of the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with the present disclosure, a spring-loaded fastening system is provided and will be described in detail below. The fastening system may facilitate convenient and expeditious installation and removal of liners (e.g., graphite liners) in process chambers of ion implanters and does not require the use of tools. Additionally, the fastening system of the present disclosure does not require caps for covering exposed mechanical fasteners. Thus, the fastening system does not create undesirable interruptions or variations in the surface texture of a liner.

Figure 1B:
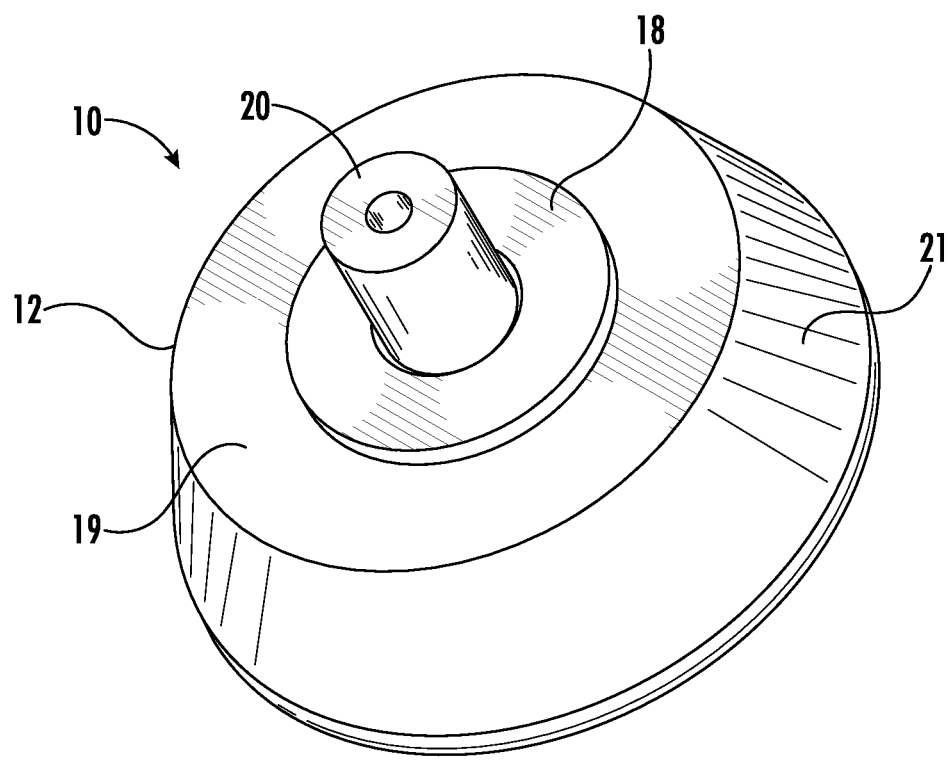
FIG. 1B is a bottom perspective view illustrating the spring-loaded fastener of FIG. 1A.

Referring to FIGS. 1A and 1B, top and bottom perspective views of a spring-loaded fastener 10 (hereinafter "the fastener 10") in accordance with a non-limiting, exemplary embodiment of the present disclosure are shown. The fastener 10 may include a generally frustoconical cleat 12 defining an interior cavity 14, a spring element 16 disposed within the cavity 14, a flat washer 18 disposed on a bottom of the cleat 12, and a shoulder bolt 20 disposed within the cavity 14 and extending through the spring element 16, the cleat 12, and the flat washer 18. In various embodiments, the cleat 12 may be formed of various metal or non-metal materials, including, and not limited to, aluminum, stainless steel, polyetheretherketone (PEEK), nylon, and Teflon. The spring element 16, the flat washer 18, and the shoulder bolt 20 may be formed of various metals including, and not limited to, steel, aluminum, various alloys, etc. The present disclosure is not limited in this regard, and any of the cleat 12, the spring element 16, the flat washer 18, and the shoulder bolt 20 may be formed of alternative materials suitable for facilitating the operation of the fastener 10 as further described below.

The cleat 12 may be radially symmetrical and may have a generally planar bottom surface 19 and a tapered sidewall 21. An upper portion of the cleat 12 may have a first diameter and a lower portion of the cleat 12 may have a second diameter, wherein the first diameter is greater than the second diameter. A top edge of the sidewall 21 may be rounded. In various embodiments, the sidewall 21 may extend from the bottom surface 19 at an angle in a range between 100 degrees and 120 degrees. In preferred embodiments, the sidewall 21 may extend from the bottom surface 19 at an angle of 110 degrees. The present disclosure is not limited in this regard.

Figure 2:
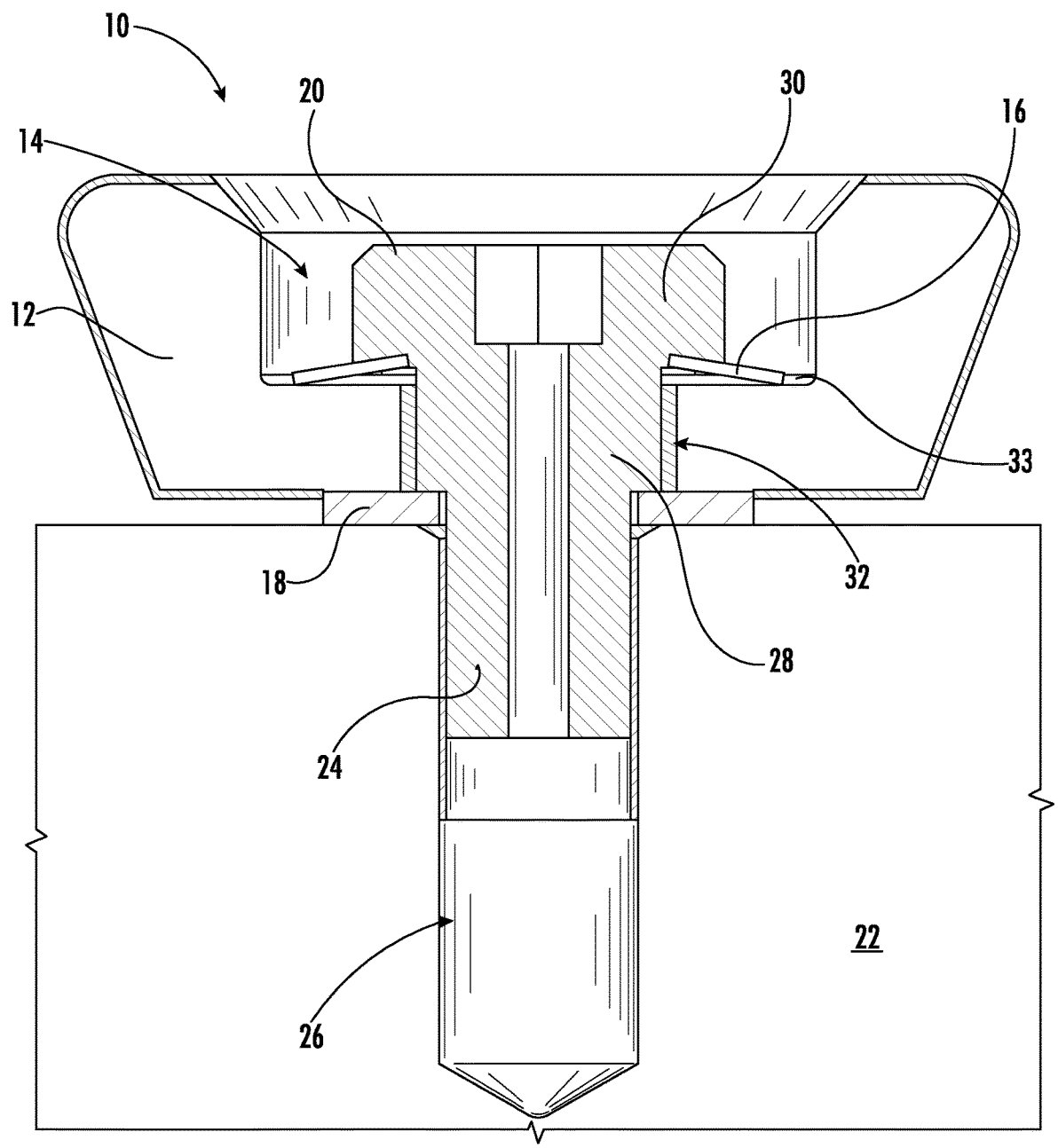
FIG. 2 is a cross-sectional side view illustrating the spring-loaded fastener of FIGS. 1A and 1B installed in a structure.

Referring now to FIG. 2, a cross-sectional side view illustrating the fastener 10 operatively mounted to a structure 22 (e.g., an interior of a process chamber of an ion implanter) is presented. For the sake of convenience and clarity, terms such as "top," "bottom," "above," "below," "lower," "upper," "downward," and "upward" may be used below to describe the relative placement and orientation of various components of the fastener 10, all with respect to the geometry and orientation of the fastener 10 as the fastener 10 appears in FIG. 2. Said terminology will include the words specifically mentioned, derivatives thereof, and words of similar import.

As shown in FIG. 2, a threaded portion 24 of the shoulder bolt 20 may be disposed in secure, threaded engagement with a correspondingly threaded borehole 26 in the structure 22. The flat washer 18, having an inner diameter larger than an outer diameter of the threaded portion 24 and smaller than an outer diameter of a shoulder portion 28 of the shoulder bolt 20, may surround the threaded portion 24 and may be axially sandwiched between a bottom surface of the shoulder portion 28 and the surface of the structure 22. The flat washer 18 may act as a stop for preventing the shoulder bolt 20 from being screwed further into the borehole 26, and in the event the borehole 26 is countersunk may ensure accurate positional contact between the fastener 10 and the structure 22. The flat washer 18 may also prevent the shoulder portion 28 from biting into and damaging the structure 22 when the shoulder bolt 20 is torqued during installation.

A head portion 30 of the shoulder bolt 20 may be disposed within the interior cavity 14 of the cleat 12, with a bottom surface of the head portion 30 seated top the spring element 16 and with the shoulder portion 28 extending through the spring element 16 and through a mounting aperture 32 in a floor 33 of the interior cavity 14. The spring element 16, having an inner diameter larger than an outer diameter of the shoulder portion 28 and smaller than an outer diameter of the head portion 30, may surround the shoulder portion 28 and may be axially sandwiched between the bottom surface of the head portion 30 and the floor 33 of the interior cavity 14. The spring element 16 may exert a downwardly-directed force on the floor 33 of the interior cavity 14, thus biasing the cleat 12 downwardly, toward the flat washer 18. The spring element 16 may allow the cleat 12 to be displaced upwardly a short distance if enough upwardly-directed force is applied to the cleat to overcome the biasing force of the spring element 16. In various embodiments, the spring element 16 may be a Belleville washer (also referred to as a coned-disc spring, conical spring washer, disc spring, Belleville spring, or spring washer). The present disclosure is not limited in this regard. In alternative embodiments, the spring element 16 may be a coil spring or other spring device adapted to bias the cleat 12 downwardly, away from the head portion 30 of the shoulder bolt 20. As will be appreciated by those of ordinary skill in the art, the biasing force imparted by the spring element 16 may be adjusted by varying the thickness of the spring element 16, the material of the spring element 16, etc.

In operation, the above-described fastener 10 may be secured to a structure, such as an interior wall or surface of a process chamber of an ion implanter, and an object, such as a liner, may be hung on the fastener 10 and thus secured to the structure. For example, referring to FIGS. 3A-5B, a series of rear and corresponding cross-sectional side views depicting a graphite liner 34 being hung on the fastener 10 are provided. The rear surface 35 of the graphite liner 34 may have a hanger pocket 36 formed therein, wherein the hanger pocket 36 may be adapted to receive and engage the fastener 10 as further described below. The fastener 10 may be mounted to the structure 22 (e.g., an interior surface of an extraction plate or other surface within a process chamber).

The hanger pocket 36 may be a generally keyhole-shaped depression or cavity formed in the rear surface of the graphite liner 34 and may be defined by a first, upper arc 38 intersecting a top of a second, lower arc 40, wherein a radius of the upper arc 38 is smaller than a radius of the lower arc 40. In various embodiments, the upper arc 38 may have an arc angle in a range of 120-180 degrees. The present disclosure is not limited in this regard. In various embodiments, the upper arc 38 may have a radius slightly larger (e.g., 2-5 millimeters larger) than a radius of the of the bottom of the cleat 12 and smaller (e.g., 5-10 millimeters smaller) than a radius of the top of the cleat 12.

Figure 3A:
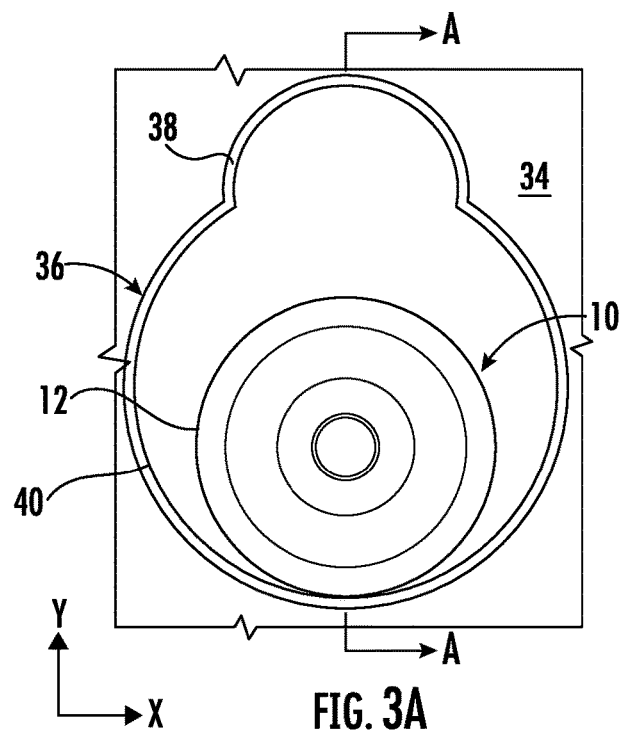
FIG. 3A is a rear view illustrating the fastening system of the present disclosure in a preliminary mounting position.
Figure 3B:
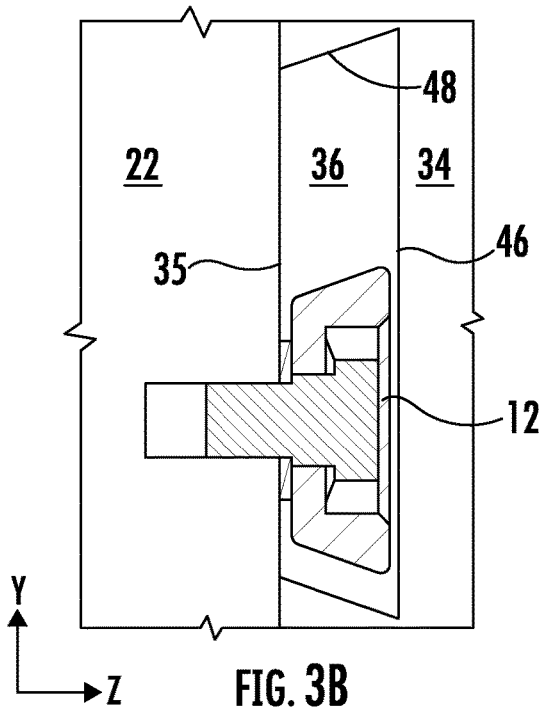
FIG. 3B is a cross-sectional side view taken along plane A-A in FIG. 3A.

Referring to FIGS. 3A and 3B, the hanger pocket 36 may be placed over the cleat 12 with the cleat 12 disposed entirely within the lower arc 40 (i.e., with no portion of the cleat 12 disposed within the upper arc 38). The hanger pocket 36 may have a minimum depth equal to or greater than a combined depth of the cleat 12 and the flat washer 18 as measured along the Z axis shown in FIG. 3B. The hanger pocket 36 may have a maximum depth not greater than the combined depth of the cleat 12 and the flat washer 18 plus the depth the cleat 12 may travel along the shoulder portion 28 of the shoulder bolt 20 when the spring element 16 is fully compressed. Thus, the rear surface of the graphite liner 34 may be placed in flat engagement with a front surface of the structure 22, and the top of the cleat 12 may extend into contact with, or nearly into contact with, a rear wall 46 of the hanger pocket 36. A sidewall 48 of the hanger pocket 36 may be angled to match the angle of the sidewall 21 of the cleat. For example, if the sidewall 21 of the cleat 12 forms an angle of 110 degrees with the bottom surface 19 of the cleat 12, the sidewall 48 of the hanger pocket 36 may form an angle of 110 degrees with the rear surface 35 of the graphite liner 34.

Figure 4A:
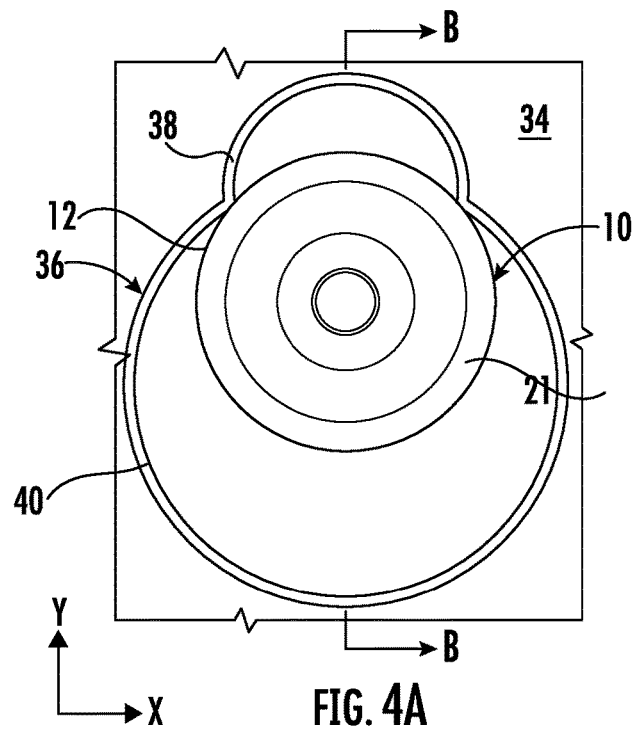
FIG. 4A is a rear view illustrating the fastening system of the present disclosure in an intermediate mounting position.
Figure 4B:
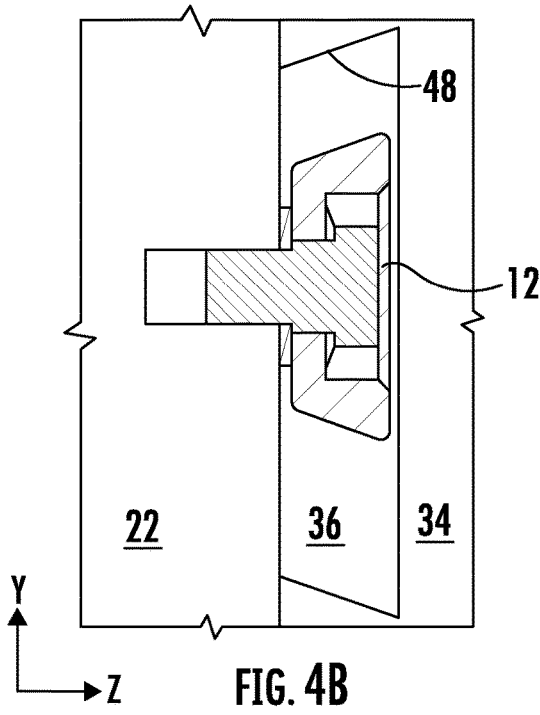
FIG. 4B is a cross-sectional side view taken along plane B-B in FIG. 4A.

Referring to FIGS. 4A and 4B, the graphite liner 34 is shown partially lowered onto the cleat 12, with the upper arc 38 of the hanger pocket 36 vertically approaching the cleat 12. If, as the graphite liner 34 is being lowered, the hanger pocket 36 is laterally centered (i.e., centered along the X axis shown in FIG. 4A) with respect to the cleat 12 in the manner shown in FIG. 4A, the graphite liner 34 may continue to be lowered and the cleat 12 may enter the upper arc 38 directly. However, if the hanger pocket 36 is laterally off-center relative to the cleat 12 as the graphite liner 34 is lowered, the sidewall 48 in the upper portion of the lower arc 40 may engage the sidewall 21 of the cleat 12. As the graphite liner 34 continues to be lowered, the engagement between the sidewall 21 of the cleat 12 and the inwardly curving sidewall 48 in the upper portion of the lower arc 40 may force the graphite liner 34 to be shifted laterally, moving the hanger pocket 36 into or near to lateral alignment with the cleat 12. The converging upper portion of the lower arc 40 may thus automatically guide or funnel the cleat 12 into the upper arc 38 as the graphite liner 34 is lowered onto the cleat 12.

Referring to FIGS. 5A and 5B, the graphite liner 34 is shown fully lowered onto the cleat 12, with the cleat 12 disposed partially within the upper arc 38 and with the sidewall 48 in the upper arc 38 seated on the sidewall 21 of the cleat 12. Since the radius of the top of the cleat 12 is larger than the radius of the upper arc 38, the cleat 12 prevents the graphite liner 34 from being horizontally pulled away from the structure 22 (i.e., pulled to the right in FIG. 5B) except if the graphite liner 34 is first lifted upwardly to shift the cleat 12 into the larger lower arc 40 (as shown in FIGS. 3A and 3B). The graphite liner 34 thus remains securely mounted to the structure 22 until the graphite liner 34 is uninstalled.

Figure 6:
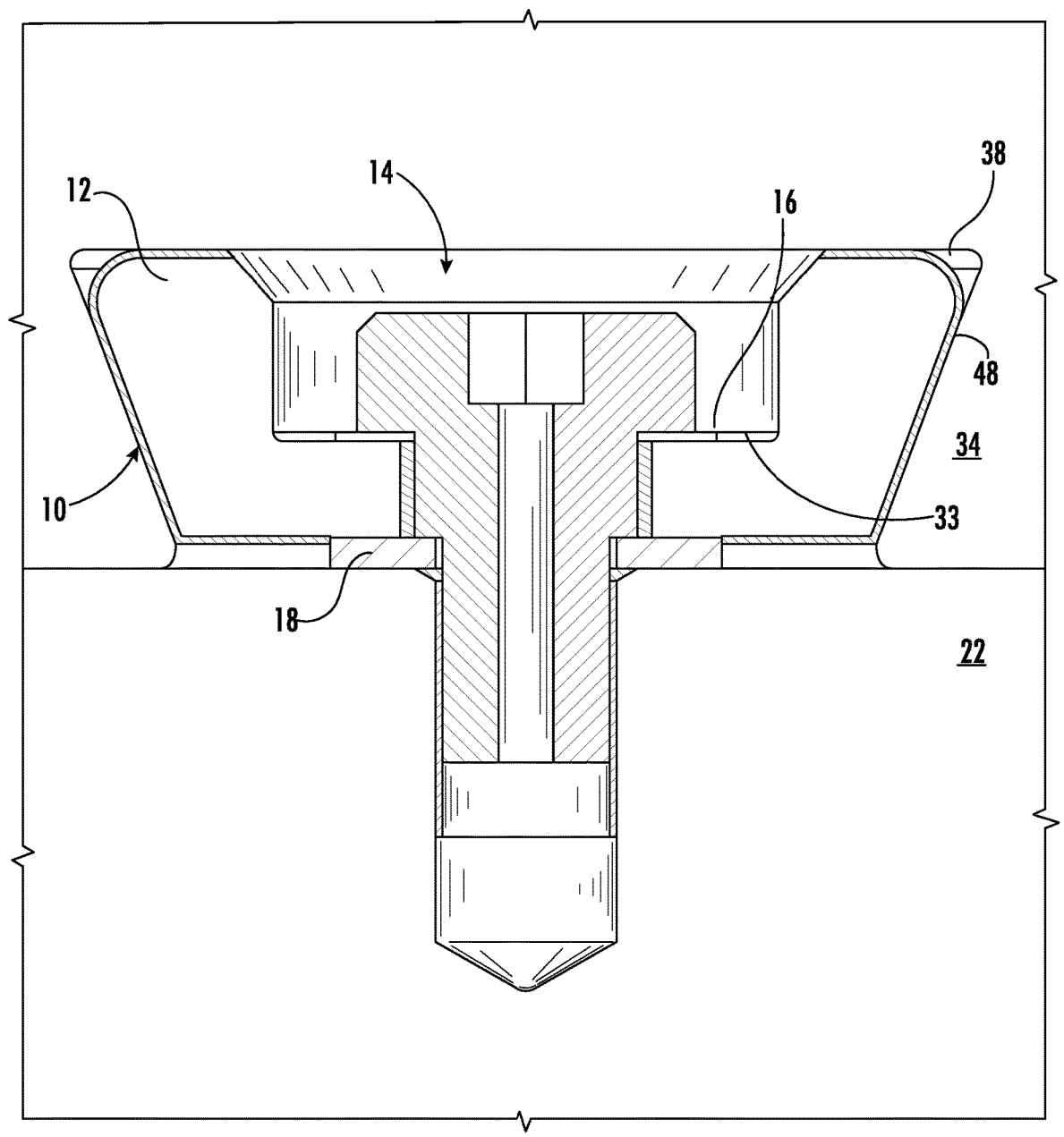
FIG. 6 is a cross-sectional bottom view taken along plane D-D in FIG. 5A.

Referring to FIG. 6, a cross-sectional bottom view illustrating the cleat 12 disposed within the upper arc 38 is shown. As described above, the spring element 16 of the fastener 10 may exert a downwardly-directed force on the floor 33 of the interior cavity 14 of the cleat 12, thus biasing the cleat 12 downwardly (with reference to the orientation of the fastener 10 as shown in FIG. 6), toward the flat washer 18. This biasing force may be communicated to the graphite liner 34 through engagement between the angled sidewall 21 of the cleat 12 and the angled sidewall 48 of the hanger pocket 36. Thus, the fastener 10 may hold the graphite liner 34 in firm engagement with the structure 22 while simultaneously allowing the cleat 12 to move away from the structure 22 (i.e., via flexure of the spring element 16). In this manner, the fastener 10 may accommodate tolerance stack up as well as thermal expansion of the structure 22, the graphite liner 34, and/or the fastener 10 while mitigating the risk of damage to the graphite liner 34 attributable to such tolerance stack up and/or thermal expansion.

Figure 7A:
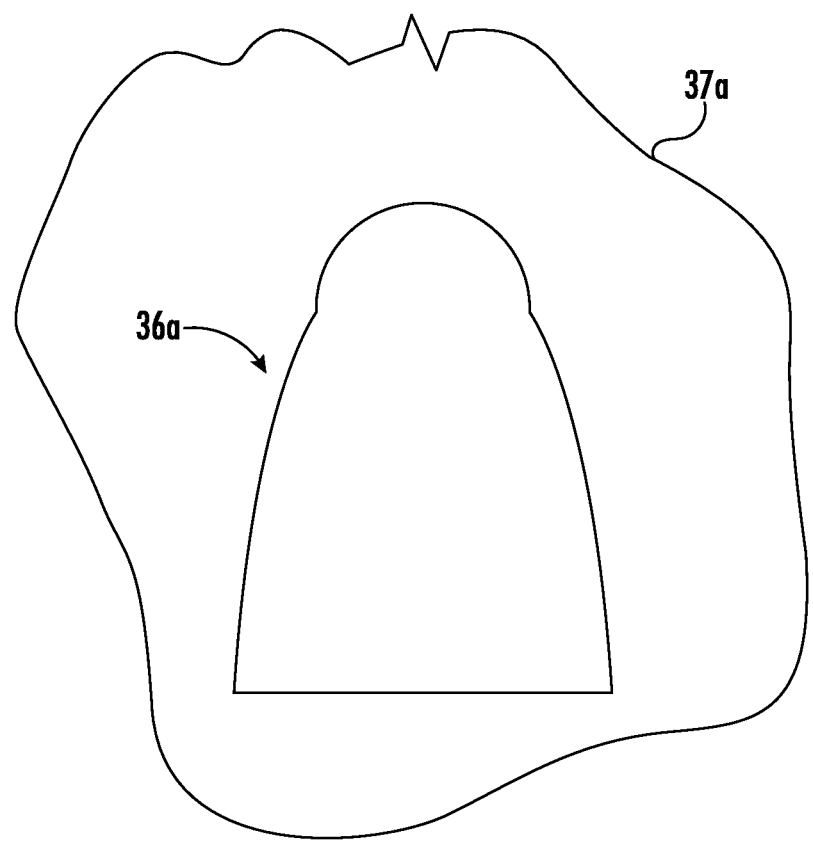
FIG. 7A-7B are cutaway plan views illustrating alternative hanger pockets in accordance with exemplary embodiments of the present disclosure.
Figure 7B:
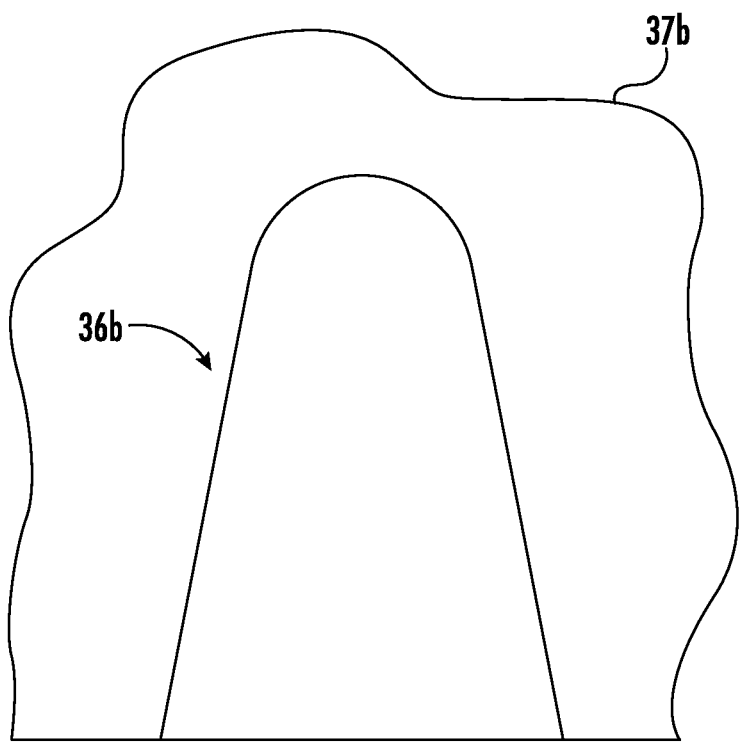

In various alternative embodiments, the hanger pocket 36 may have a variety of different shapes other than the shape described above and depicted in FIGS. 3A-5B, as long as such shapes include a lower portion having an opening in the rear surface of a liner large enough to accommodate the top the cleat 12. For example, referring to FIG. 7A, an alternative hanger pocket 36a is shown formed in a portion of a liner 37a, wherein the hanger pocket 36a has a generally semi-circular upper portion intersecting a generally arch-shaped lower portion. Referring to FIG. 7B, an alternative hanger pocket 36b is shown formed in a portion of a liner 37b, wherein the hanger pocket 36b has an upper portion and a lower portion defining a contiguous arch, and wherein a bottom of the hanger pocket 36b extends through a bottom edge of the liner 37b. The present disclosure is not limited in this regard.

Referring to FIG. 8, an exemplary implementation of the fastening system of the present disclosure is shown, wherein the fastening system is used to removably mount a graphite liner 50 to an interior surface 52 of a process chamber. Particularly, three fasteners 10a, 10b, 10c identical to the fastener 10 described above may be secured (e.g., bolted) to the chamber-facing side of the interior surface 52 at various locations (the three fasteners 10a, 10b, 10c are located behind the graphite liner 50 and are thus illustrated in dashed lines). The graphite liner 50 may include three hanger pockets 36a, 36b, 36c identical to the hanger pocket 36 described above formed in a rear surface thereof (and thus illustrated in dashed lines) at locations corresponding to the locations of the fasteners 10a, 10b, 10c. The graphite liner 50 may be removably fastened to the interior surface 52 by placing the hanger pockets 36a, 36b, 36c over, and lowering the hanger pockets 36a, 36b, 36c onto, the fasteners 10a, 10b, 10c in the manner described above with regard to the hanger pocket 36 and the fastener 10. While not shown in the example provided in FIG. 8, various implementations are contemplated wherein, in addition to the fastening system of the present disclosure, one or more conventional mechanical fasteners (e.g., screws, bolts, etc.) may inserted through corresponding mounting apertures in the graphite liner 50 and secured to the interior surface 52 to ensure the graphite liner 50 cannot be inadvertently jostled out of place. Such mechanical fasteners may be covered with graphite caps on the chamber-facing side of the graphite liner 50.

As will be appreciated by those of ordinary skill in the art, the above-described fastening system provides an advantage in the art by facilitating convenient, expeditious installation and removal of liners (e.g., graphite liners) in process chambers of ion implanters and does not require the use of tools. Additionally, the fastening system does not require any mechanical fasteners or caps to be installed in the chamber-facing side of a liner, and thus does not introduce undesirable interruptions or variations into the surface texture of the chamber-facing side of a liner. Still further, the fastener of the present disclosure dynamically accommodates tolerance stack up and thermal expansion of surrounding structures while mitigating the risk of damage to an attached liner attributable to such tolerance stack up and/or thermal expansion.

As used herein, an element or step recited in the singular and proceeded with the word "a" or "an" will be understood as not excluding plural elements or steps, unless such exclusion is explicitly recited. Furthermore, references to "one embodiment" of the present disclosure are not intended to be interpreted as excluding the existence of additional embodiments incorporating the recited features.

The present disclosure is, not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A spring-loaded fastener comprising:
   a frustoconical cleat having an interior cavity;
   a spring element disposed on a floor of the interior cavity; and
   a shoulder bolt disposed in the interior cavity, wherein a bottom surface of a head portion of the shoulder bolt is disposed on the spring element, wherein a shoulder portion of the shoulder bolt extends through a mounting aperture in the floor of the interior cavity, and wherein a threaded portion of the shoulder bolt extends from the shoulder portion and is adapted to threadedly engage a structure to which the spring-loaded fastener is fastened;
   wherein the head portion, shoulder portion, and threaded portion of the shoulder bolt are axially movable relative to the frustoconical cleat.

2. The spring-loaded fastener of claim 1, wherein the spring element is annular and has an inner diameter smaller than a diameter of the head portion of the shoulder bolt and has an outer diameter larger than the diameter of the head portion of the shoulder bolt.

3. The spring-loaded fastener of claim 1, further comprising a flat washer disposed adjacent a bottom surface of the cleat, wherein a bottom surface of the shoulder portion of the shoulder bolt is disposed on the flat washer and wherein the threaded portion of the shoulder bolt extends through the flat washer.

4. The spring-loaded fastener of claim 3, wherein the flat washer has an inner diameter smaller than a diameter of the shoulder portion of the shoulder bolt and has an outer diameter larger than a diameter of the mounting aperture.

5. The spring-loaded fastener of claim 1, wherein the spring element is one of a spring washer and a coil spring.

6. The spring-loaded fastener of claim 1, wherein the spring element biases the head portion of the shoulder bolt and the floor of the interior cavity of the cleat away from one another.

7. The spring-loaded fastener of claim 1, wherein the cleat is formed of one of aluminum, stainless steel, polyetheretherketone, nylon, and Teflon.

8. The spring-loaded fastener of claim 1, wherein a sidewall of the cleat extends from a bottom surface of the cleat at an angle in a range of 100 degrees to 120 degrees.

9. A spring-loaded fastening system for fastening a liner to a structure, the spring-loaded fastening system comprising:
   spring-loaded fastener comprising:
      a frustoconical cleat having an interior cavity;
      a spring element disposed on a floor of the interior cavity; and
      a shoulder bolt disposed in the interior cavity, wherein a bottom surface of a head portion of the shoulder bolt is disposed on the spring element, wherein a shoulder portion of the shoulder bolt extends through a mounting aperture in the floor of the interior cavity, and wherein a threaded portion of the shoulder bolt is fastened to the structure; and
   a hanger pocket in a rear surface of the liner, the hanger pocket comprising:
      a first portion defining an opening in the rear surface of the liner large enough to accommodate a diameter of a lower portion of the cleat and not large enough to accommodate a diameter of an upper portion of the cleat; and
      a second portion adjoining the first portion and defining an opening in the rear surface of the liner large enough to accommodate the diameter of the upper portion of the cleat.

10. The spring-loaded fastening system of claim 9, wherein the spring element is annular and has an inner diameter smaller than a diameter of the head portion of the shoulder bolt and has an outer diameter larger than the diameter of the head portion of the shoulder bolt.

11. The spring-loaded fastening system of claim 9, further comprising a flat washer disposed adjacent a bottom surface of the cleat, wherein a bottom surface of the shoulder portion of the shoulder bolt is disposed on the flat washer and wherein a threaded portion of the shoulder bolt extends through the flat washer.

12. The spring-loaded fastening system of claim 11, wherein the flat washer has an inner diameter smaller than a diameter of the shoulder portion of the shoulder bolt and has an outer diameter larger than a diameter of the mounting aperture.

13. The spring-loaded fastening system of claim 9, wherein the spring element is one of a spring washer and a coil spring.

14. The spring-loaded fastening system of claim 9, wherein the spring element biases the head portion of the shoulder bolt and the floor of the interior cavity of the cleat away from one another.

15. The spring-loaded fastening system of claim 9, wherein the cleat is formed of one of aluminum, stainless steel, polyetheretherketone, nylon, and Teflon.

16. The spring-loaded fastening system of claim 9, wherein a sidewall of the cleat extends from a bottom surface of the cleat at an angle in a range of 100 degrees to 120 degrees.

17. The spring-loaded fastening system of claim 9, wherein a sidewall of the cleat extends from a bottom surface of the cleat at a first angle, and wherein a sidewall of the hanger pocket extends from a rear surface of the liner at a second angle, wherein the first angle is equal to the second angle.

18. The spring-loaded fastening system of claim 9, wherein the hanger pocket has a depth equal to or greater than a combined depth of the cleat and a flat washer disposed adjacent a bottom surface of the cleat.

19. The spring-loaded fastening system of claim 9, wherein a sidewall of the hanger pocket is disposed on a sidewall of the cleat.

20. A spring-loaded fastening system for fastening a liner to a structure, the spring-loaded fastening system comprising:
spring-loaded fastener comprising:
a frustoconical cleat having an interior cavity;
a spring element disposed on a floor of the interior cavity; and
a shoulder bolt disposed in the interior cavity, wherein a bottom surface of a head portion of the shoulder bolt is disposed on the spring element, wherein a shoulder portion of the shoulder bolt extends through a mounting aperture in a floor of the interior cavity, and wherein a threaded portion of the shoulder bolt is fastened to the structure; and
a hanger pocket in a rear surface of the liner, the hanger pocket comprising:
a first portion defining an opening in the rear surface of the liner large enough to accommodate a diameter of a lower portion of the cleat and not large enough to accommodate a diameter of an upper portion of the cleat; and
a second portion adjoining the first portion and defining an opening in the rear surface of the liner large enough to accommodate the diameter of the upper portion of the cleat;
wherein a sidewall of the cleat extends from a bottom surface of the cleat at a first angle, and wherein a sidewall of the hanger pocket extends from a rear surface of the liner at a second angle, wherein the first angle is equal to the second angle; and wherein the cleat is disposed within the first portion of the hanger pocket and wherein the sidewall of the hanger pocket is disposed on the sidewall of the cleat.

* * * * *